(12) United States Patent
Park et al.

(10) Patent No.: US 10,373,873 B1
(45) Date of Patent: Aug. 6, 2019

(54) GATE CUT IN REPLACEMENT METAL GATE PROCESS

(71) Applicant: GLOBALFOUNDRIES INC., Grand Cayman (KY)

(72) Inventors: Chanro Park, Clifton Park, NY (US); Ruilong Xie, Schenectady, NY (US); Kangguo Cheng, Schenectady, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/933,708

(22) Filed: Mar. 23, 2018

(51) Int. Cl.
*H01L 21/8234* (2006.01)
*H01L 29/66* (2006.01)

(52) U.S. Cl.
CPC ........... *H01L 21/823431* (2013.01); *H01L 21/823418* (2013.01); *H01L 21/823481* (2013.01); *H01L 29/66545* (2013.01)

(58) Field of Classification Search
CPC .............................................. H01L 21/823431
USPC ........................................................ 438/283
See application file for complete search history.

(56) References Cited

U.S. PATENT DOCUMENTS

| | | | | |
|---|---|---|---|---|
| 9,640,633 | B1 * | 5/2017 | Greene | H01L 29/66545 |
| 9,818,836 | B1 * | 11/2017 | Sung | H01L 29/513 |
| 9,935,104 | B1 * | 4/2018 | Wang | H01L 27/0886 |
| 9,984,936 | B1 * | 5/2018 | Xie | H01L 29/775 |
| 10,090,402 | B1 * | 10/2018 | Park | H01L 29/66795 |
| 2014/0084383 | A1 * | 3/2014 | Cai | H01L 29/66545 257/401 |
| 2014/0231914 | A1 * | 8/2014 | Chang | H01L 29/66545 257/347 |
| 2015/0129934 | A1 * | 5/2015 | Xie | H01L 27/0886 257/192 |
| 2015/0236159 | A1 * | 8/2015 | He | H01L 29/66795 257/401 |
| 2017/0084723 | A1 * | 3/2017 | Greene | H01L 21/3213 |
| 2019/0067115 | A1 * | 2/2019 | Park | H01L 21/823437 |

* cited by examiner

*Primary Examiner* — Jami Valentine Miller
(74) *Attorney, Agent, or Firm* — Francois Pagette; Hoffman Warnick LLC (57) ABSTRACT

Gate isolation methods and structures for a FinFET device leverage the definition and formation of a gate cut opening within a sacrificial gate layer prior to patterning the sacrificial gate layer to form a sacrificial gate. The gate cut opening formed in the sacrificial gate layer is filled with a sacrificial isolation layer. After forming source/drain junctions over source/drain regions of a fin, the sacrificial isolation layer is replaced with an isolation layer, and the sacrificial gate is replaced with a functional gate.

15 Claims, 9 Drawing Sheets

GATE CUT IN REPLACEMENT METAL GATE PROCESS

BACKGROUND

The present application relates generally to semiconductor devices, and more specifically to methods for manufacturing fin field effect transistors.

Fully-depleted devices such as fin field effect transistors (FinFETs) are candidates to enable scaling of next generation gate lengths to 14 nm and below. Fin field effect transistors (FinFETs) present a three-dimensional architecture where the transistor channel is raised above the surface of a semiconductor substrate, rather than locating the channel at or just below the surface. With a raised channel, the gate can be wrapped around the sides of the channel, which provides improved electrostatic control of the device.

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture.

The gate structure may be formed using a gate-first or a gate-last fabrication process. A gate-last process, such as a replacement metal gate (RMG) process, utilizes a sacrificial or dummy gate, which is typically replaced by a functional gate after device activation, i.e., after dopant implantation into source/drain regions of the fins and an associated drive-in anneal, in order to avoid exposing the functional gate materials to the thermal budget associated with activation.

Prior to removing the sacrificial gate and forming a functional gate, a gate cut module may be used to sever (i.e., segment) the sacrificial gate in order to define and isolate plural adjacent devices. In association with such a process, portions of the sacrificial gate are removed to form openings that are backfilled with an etch selective dielectric material, i.e., isolation layer, that provides a barrier between adjacent functional gates following removal and replacement of remaining portions of the sacrificial gates. At advanced nodes, however, notwithstanding recent developments, it remains a challenge to define a gate cut opening with both the desired critical dimension(s) and alignment precision amidst a plurality of densely-arrayed fins.

SUMMARY

Accordingly, it would be beneficial to provide a method for defining a sacrificial gate at critical dimensions with a high degree of accuracy and precision, especially a sacrificial gate that enables formation of a functional replacement metal gate at advanced nodes without altering design rules or otherwise compromising real estate.

As used herein, a "functional gate" refers to a structure used to control output current (i.e., the flow of carriers through a channel) of a semiconductor device using an electrical field or, in some instances, a magnetic field, and includes a gate dielectric and a gate conductor.

Disclosed is a gate cut scheme that may be used in conjunction with a replacement metal gate (RMG) process flow for manufacturing fin field effect transistors (FinFETs). In accordance with various embodiments, after forming a sacrificial gate layer but prior to patterning the sacrificial gate layer to form a sacrificial gate, a gate cut region is defined and the sacrificial gate layer is etched to form a gate cut opening within the gate cut region. A sacrificial isolation layer is formed within the gate cut opening. Photolithography and etching techniques are then used to form a sacrificial gate. The sacrificial gate includes the sacrificial gate layer material within active device regions, and the sacrificial isolation layer material within gate cut regions.

Following additional manufacturing steps, including the formation of sidewall spacers, epitaxial source/drain junctions, and an interlayer dielectric, the sacrificial isolation layer may be selectively removed from within gate cut regions, and the resulting openings backfilled with an isolation layer. A subsequent replacement metal gate module may include removal of remaining portions of the sacrificial gate and the formation of a functional gate.

By pre-defining the gate cut region, i.e., prior to forming the sacrificial gate, and depositing an etch-selective sacrificial isolation layer within the gate cut region, the gate cut opening can be defined using a selective, isotropic etch, which avoids undesired exposure of the sacrificial gate layer, especially prior to the formation of epitaxial source/drain junctions.

According to various embodiments, a method of forming a device includes forming a plurality of fins over a semiconductor substrate, forming a dielectric layer over the substrate between the fins, and depositing a sacrificial gate layer over the fins and over the dielectric layer.

An opening is formed in the sacrificial gate layer between a pair of the fins, and a sacrificial isolation layer is deposited within the opening. The sacrificial gate layer and the sacrificial isolation layer are then etched to form a sacrificial gate, and a spacer layer is formed over sidewalls of the sacrificial gate.

The method further includes removing the sacrificial isolation layer from within the opening, e.g., after forming the spacer layer, depositing an isolation layer within the opening, and etching remaining portions of the sacrificial gate layer selectively with respect to the isolation layer to form a gate opening. The gate opening may expose a top surface of the fin. A gate dielectric layer is formed over the fin within the gate opening, and a gate conductor layer is formed over the gate dielectric layer.

According to a further embodiment, a method of forming a device includes forming a plurality of fins over a substrate, depositing a sacrificial gate layer over the fins, forming an opening in the sacrificial gate layer between a pair of the fins, and depositing a sacrificial isolation layer within the opening.

The sacrificial gate layer and the sacrificial isolation layer are then etched to form a sacrificial gate, and a spacer layer is formed over sidewalls of the sacrificial gate. The sacrificial gate and spacer layer may be used to template the formation of source/drain junctions, for example. Then, the sacrificial isolation layer is removed from within the opening and an isolation layer is deposited within the opening.

Remaining portions of the sacrificial gate layer are removed to form a gate opening. A gate dielectric layer and a gate conductor layer are successively formed within the gate opening.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which.

DETAILED DESCRIPTION

Reference will now be made in greater detail to various embodiments of the subject matter of the present application, some embodiments of which are illustrated in the accompanying drawings. The same reference numerals will be used throughout the drawings to refer to the same or similar parts.

Disclosed are FinFET device structures and methods of manufacturing FinFET devices, and more particularly methods where the separation of adjacent devices includes the formation of a gate cut opening in a sacrificial gate layer prior to patterning the sacrificial gate layer to form a sacrificial gate. The gate cut opening is initially backfilled with a sacrificial isolation layer. The sacrificial gate layer and the inlaid sacrificial isolation layer are patterned together to form a sacrificial gate, which enables additional processing including the formation of sidewall spacers over sidewalls of the sacrificial gate, and source/drain junctions over source/drain regions of the fins. A wet etch may be used to selectively remove the sacrificial isolation layer to re-open the gate cut openings, which are then filled with an isolation layer prior to removing the sacrificial gate and forming functional gates over channel regions of the fins. The disclosed method decreases the propensity for etch damage to the sidewall spacers and the attendant, undesired exposure of the underlying sacrificial gate layer prior to the formation of the source/drain junctions. Thus, unwanted epitaxial growth from an exposed sacrificial gate can be avoided.

The present approach enables precise alignment of the gate cut openings, i.e., isolation layer. In various embodiments, a distance or gap (g) between the sidewall of the isolation layer and an adjacent fin may be less than 20 nm, e.g., 12, 14, 16 or 18 nm, including ranges between any of the foregoing values. Decreasing the distance (g) beneficially impacts the achievable density of devices. Using the presently-disclosed methods, a structure can be formed having a controlled and consistent distance (g) between the sidewall of an isolation layer and an adjacent fin without altering the design rules for the structure.

Various embodiments related to the formation of FinFET structures using a sacrificial isolation layer in conjunction with a replacement metal gate process are described herein with reference to FIGS. 1-9.

Figure 1:
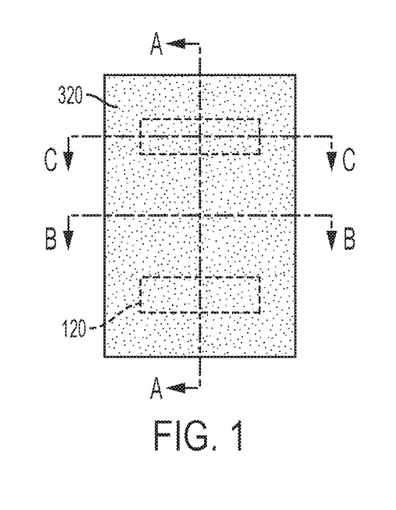
FIG. 1 is a top-down, plan view schematic diagram of a pair of fins formed over a semiconductor substrate.

A simplified top-down plan view schematic diagram of a FinFET architecture at an intermediate stage of fabrication is shown in FIG. 1. Plural semiconductor fins 120 are arrayed over a semiconductor substrate (not shown) and a sacrificial gate layer 320 is formed over the fins 120. In FIG. 1, reference line A is oriented perpendicular to a length dimension of the fins 120, reference line B is oriented parallel to a length dimension of the fins 120 between adjacent fins, and reference line C is taken parallel to the fin length along a fin 120.

Figure 2:
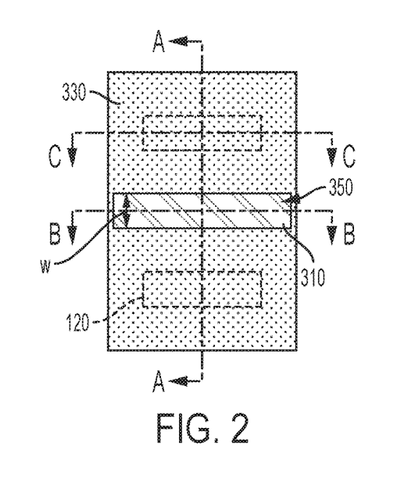
FIG. 2 is a top-down plan view showing the formation of a gate cut opening within the sacrificial gate layer between the fins.
Figure 2A:
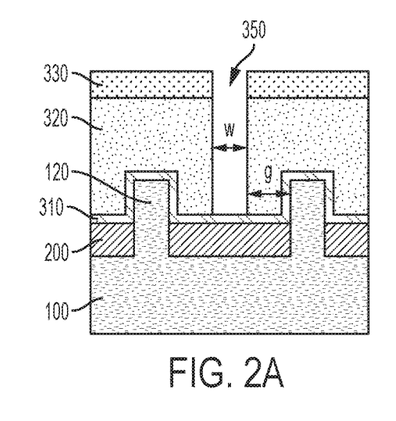
FIG. 2A shows the gate cut opening between adjacent fins and over the STI layer.
Figure 2B:
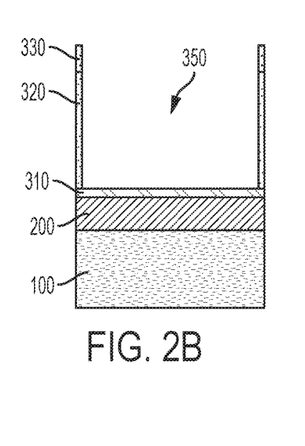
FIG. 2B shows the gate cut opening over the STI layer.
Figure 2C:
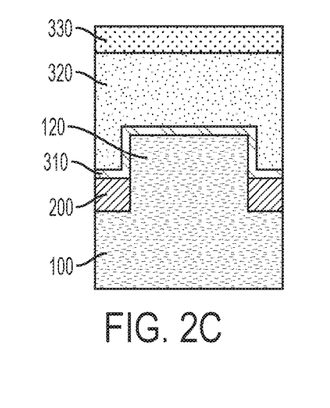
FIG. 2C is a cross-sectional view of the structure of FIG. 2 along one of the fins.
Figure 3:
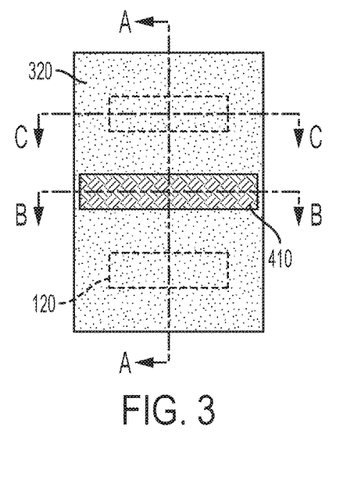
FIG. 3 shows the deposition of a sacrificial isolation layer within the gate cut opening.
Figure 3A:
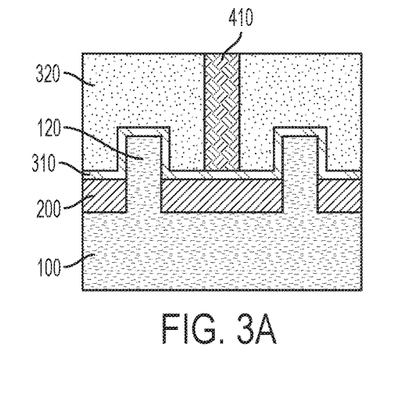
FIG. 3A depicts the sacrificial isolation layer disposed within the gate cut opening following a planarization step.
Figure 3B:
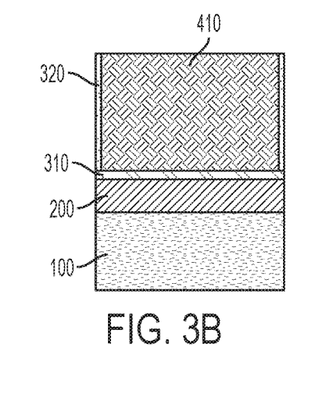
FIG. 3B depicts the formation and planarization of the sacrificial isolation layer within the gate cut opening.
Figure 3C:
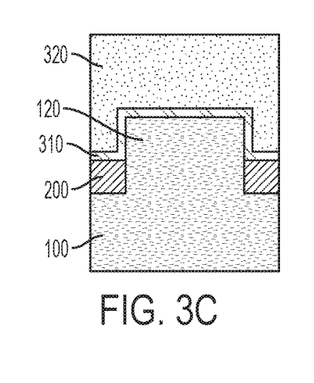
FIG. 3C is a cross-sectional view along one of the fins showing the sacrificial gate layer overlying a fin.
Figure 4:
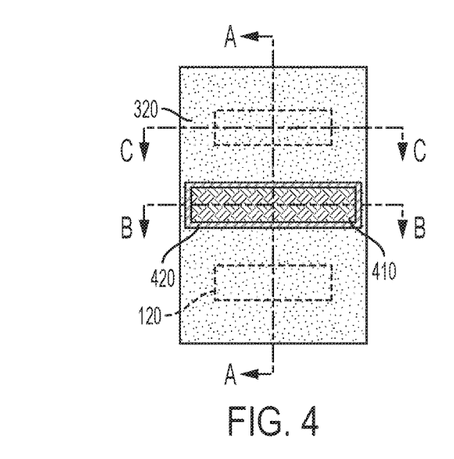
FIG. 4 shows the formation of a critical dimension (CD) modification layer within the gate cut opening prior to forming the sacrificial isolation layer according to various embodiments.
Figure 4A:
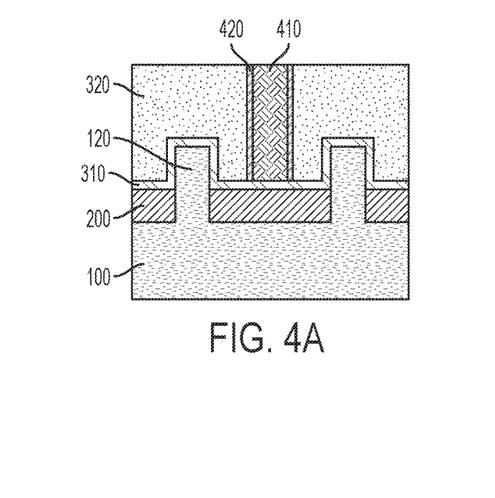
FIG. 4A depicts the formation of the critical dimension (CD) modification layer over sidewalls of the sacrificial gate layer within the gate cut opening.
Figure 4B:
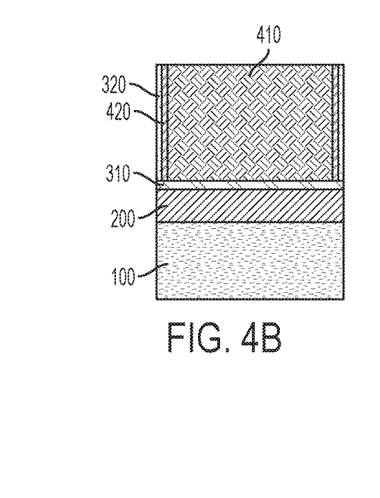
FIG. 4B depicts the formation of the critical dimension (CD) modification layer over sidewalls of the sacrificial gate layer within the gate cut opening.
Figure 4C:
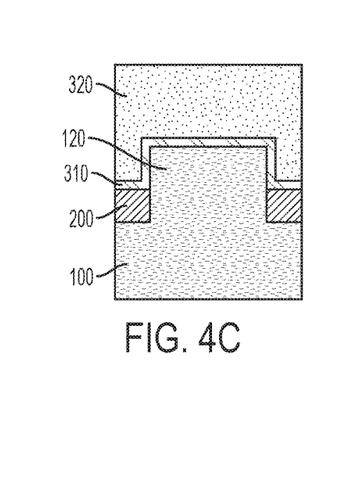
FIG. 4C is a cross-sectional view along one of the fins following deposition of the critical dimension (CD) modification layer.
Figure 5:
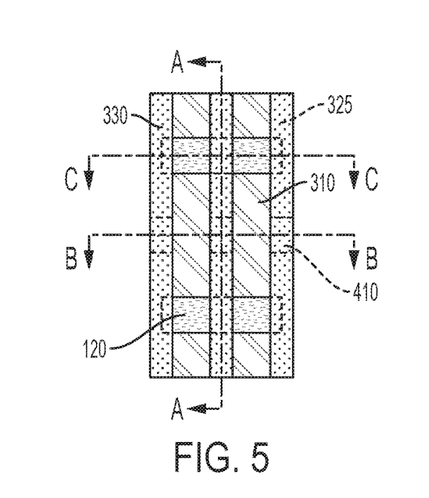
FIG. 5 shows the structure of FIG. 3 following patterning of the sacrificial gate layer and the sacrificial isolation layer to form a plurality of sacrificial gates overlapping the fins.
Figure 5A:
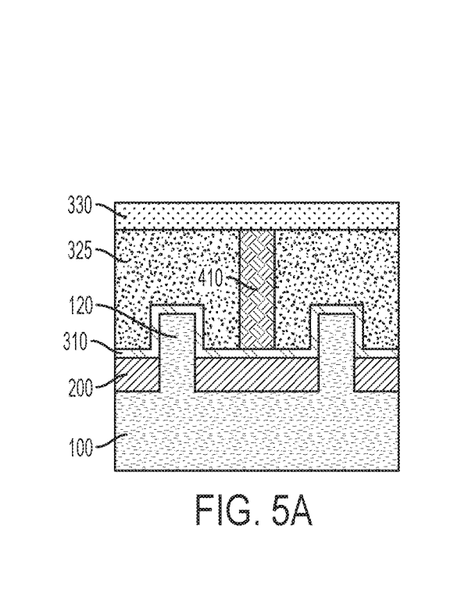
FIG. 5A shows a sacrificial gate including the sacrificial gate layer and the sacrificial isolation layer overlying the fins.
Figure 5B:
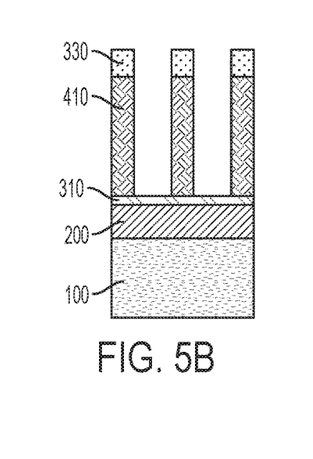
FIG. 5B depicts a cross-section of the sacrificial gates between fins and through the sacrificial isolation layer.
Figure 5C:
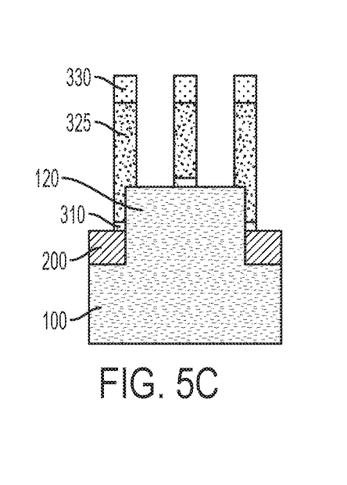
FIG. 5C shows plural sacrificial gates disposed over a fin.
Figure 6:
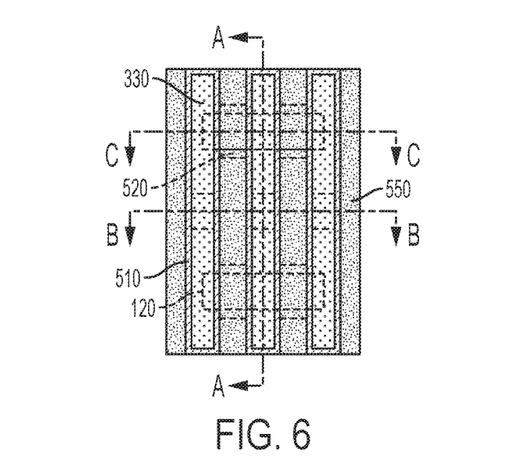
FIG. 6 shows the formation of sidewall spacers over the sacrificial gates, the formation of source/drain junctions over the fins at self-aligned locations between the sidewall spacers, and the formation of an interlayer dielectric.
Figure 6A:
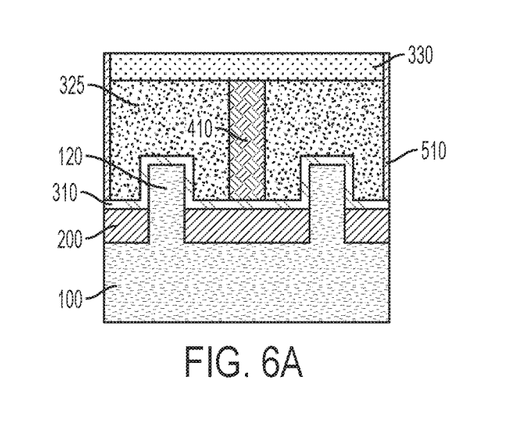
FIG. 6A shows the sacrificial gate including the sacrificial gate layer and the sacrificial isolation layer overlying the fins and a hard mask overlying the sacrificial gate.
Figure 6B:
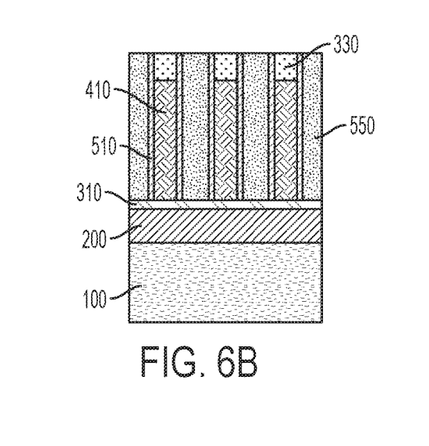
FIG. 6B shows the sacrificial isolation layer, sidewall spacers disposed over the sacrificial isolation layer, and the interlayer dielectric disposed between sidewall spacers following a planarization step.
Figure 6C:
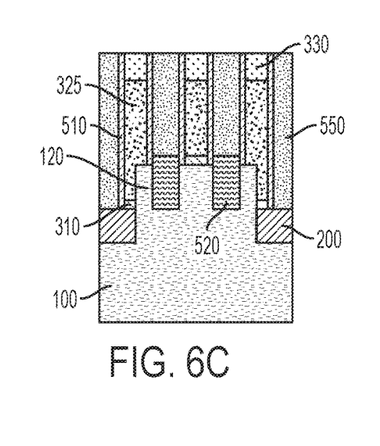
FIG. 6C shows the formation of sidewall spacers over the sacrificial gates, source/drain junctions over the fins at self-aligned locations between the sidewall spacers, and the formation of an interlayer dielectric over the source/drain junctions.
Figure 7:
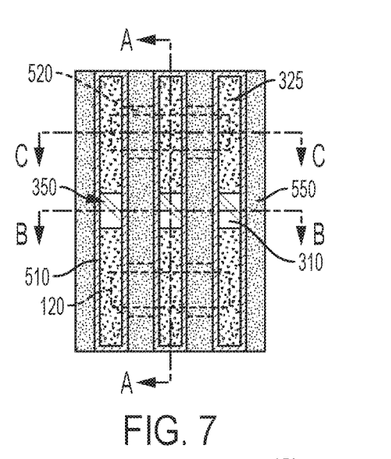
FIG. 7 shows the selective removal of the sacrificial isolation layer from within the gate cut openings.
Figure 7A:
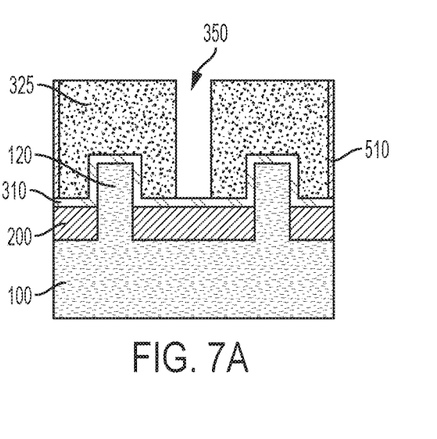
FIG. 7A shows removal of the sacrificial isolation layer from within gate cut openings selectively with respect to the sacrificial gate.
Figure 7B:
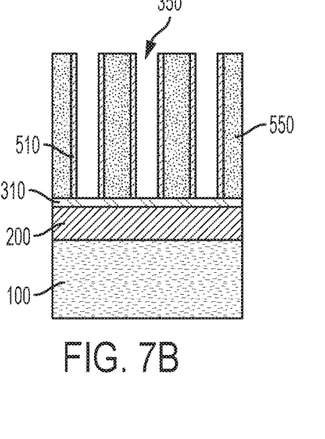
FIG. 7B shows removal of the sacrificial isolation layer within gate cut openings selectively with respect to the sidewall spacers and the interlayer dielectric.
Figure 7C:
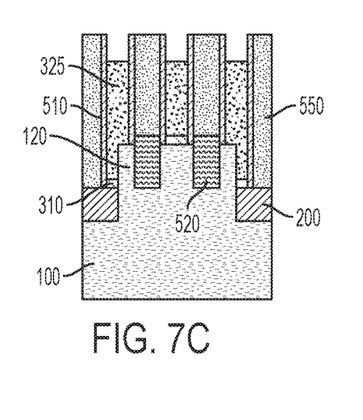
FIG. 7C is a cross-sectional view through the sacrificial gates showing removal of the hard mask from over the sacrificial gates.
Figure 8:
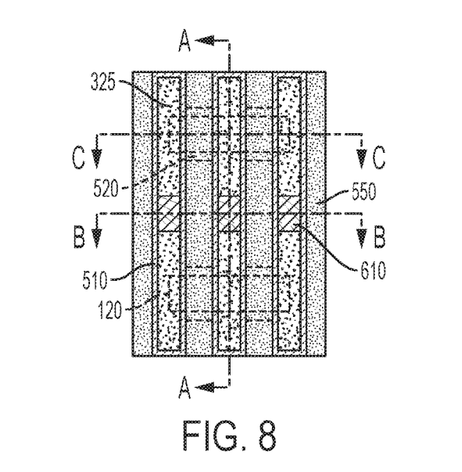
FIG. 8 shows the deposition of an isolation layer within the gate cut openings.
Figure 8A:
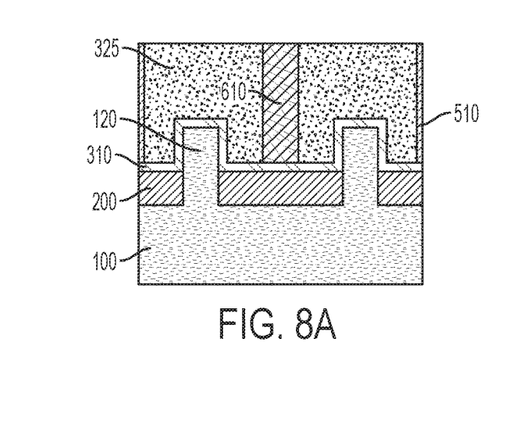
FIG. 8A shows the deposition of the isolation layer within a gate cut opening and over the sacrificial oxide layer.
Figure 8B:
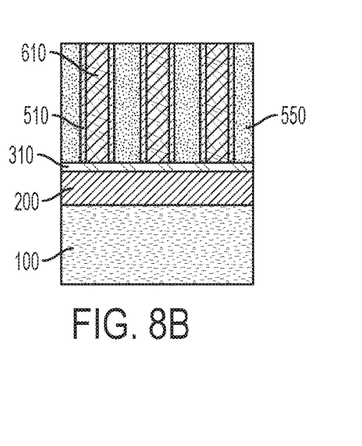
FIG. 8B shows the deposition of the isolation layer over the sidewall spacers within the gate cut openings.
Figure 8C:
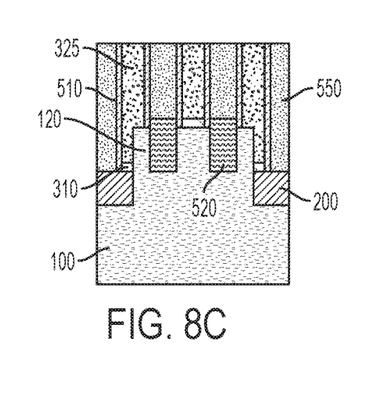
FIG. 8C depicts sacrificial gates disposed over channel regions of a fin and source/drain junctions disposed over source/drain regions of the fin.

Cross-sectional views of the FIG. 1 architecture are shown in FIGS. 2A-2C. FIG. 2A is taken along line A of FIG. 1, FIG. 2B is taken along line B, and FIG. 2C is taken along line C. The foregoing relationships between the top-down plan views and corresponding cross-sectional views are used herein for each of FIGS. 1-9.

Figure 1A:
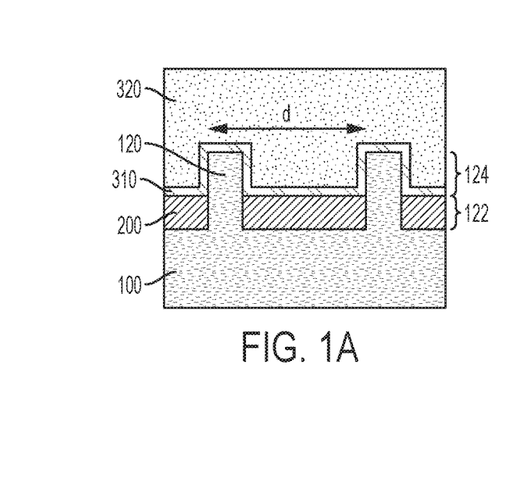
FIG. 1A is a cross-sectional view of the structure of FIG. 1 across the pair of fins showing the formation of a shallow trench isolation layer (STI), sacrificial gate oxide and sacrificial gate layer over the fins.
Figure 1B:
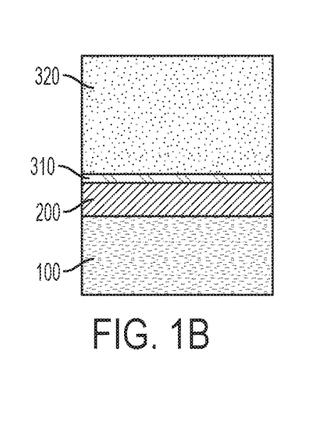
FIG. 1B is a cross-sectional view of the structure of FIG. 1 between the fins.
Figure 1C:
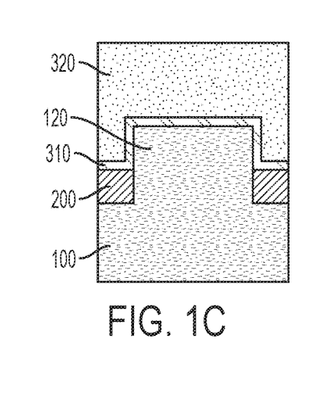
FIG. 1C is a cross-sectional view of the structure of FIG. 1 along one of the fins.

With particular reference to FIG. 1A, the exemplary structure includes a semiconductor substrate 100 and a plurality of semiconductor fins 120 disposed over the substrate 100. The semiconductor fins 120 are arranged in parallel and are laterally isolated from each other within a sub-fin region 122 by a shallow trench isolation layer 200. The fins 120 extend above a top surface of the shallow trench isolation layer (STI) layer 200 and define an active device region 124.

Substrate 100 may include a semiconductor material such as silicon, e.g., single crystal Si or polycrystalline Si, or a silicon-containing material. Silicon-containing materials include, but are not limited to, single crystal silicon germanium (SiGe), polycrystalline silicon germanium, silicon doped with carbon (Si:C), amorphous Si, as well as combinations and multi-layers thereof. As used herein, the term "single crystal" denotes a crystalline solid, in which the crystal lattice of the entire solid is substantially continuous and substantially unbroken to the edges of the solid with substantially no grain boundaries.

The substrate 100 is not limited to silicon-containing materials, however, as the substrate 100 may include other semiconductor materials, including Ge and compound semiconductors, including III-V compound semiconductors such as GaAs, InAs, GaN, GaP, InSb, ZnSe, and ZnS, and II-VI compound semiconductors such as CdSe, CdS, CdTe, ZnSe, ZnS and ZnTe.

Substrate 100 may be a bulk substrate or a composite substrate such as a semiconductor-on-insulator (SOI) substrate that includes, from bottom to top, a handle portion, an isolation layer (e.g., buried oxide layer), and a semiconductor material layer.

Substrate 100 may have dimensions as typically used in the art and may be, for example, a semiconductor wafer. Example wafer diameters include, but are not limited to, 50, 100, 150, 200, 300 and 450 mm. The total substrate thickness may range from 250 microns to 1500 microns, although in particular embodiments the substrate thickness is in the range of 725 to 775 microns, which corresponds to thickness dimensions commonly used in silicon CMOS processing. The semiconductor substrate 100 may include (100)-oriented silicon or (111)-oriented silicon, for example.

In various embodiments, fins 120 include a semiconductor material such as silicon, and may be formed by patterning and then etching the semiconductor substrate 100, e.g., a top portion of the semiconductor substrate. In several embodiments, the fins 120 are etched from, and therefore contiguous with the semiconductor substrate 100. For instance, fins 120 may be formed using a sidewall image transfer (SIT) process as known to those skilled in the art.

In certain embodiments, the fins 120 can have a width of 5 nm to 20 nm and a height of 40 nm to 150 nm, although other dimensions are also contemplated. Fins 120 may be arrayed on the substrate at a regular intrafin spacing or pitch (d). As used herein, the term "pitch" refers to the sum of the fin width and the spacing between a pair of adjacent fins. In example embodiments, the fin pitch (d) may be within a range of 20 to 100 nm, e.g., 20, 30, 40, 50, 60, 70, 80, 90 or 100 nm, including ranges between any of the foregoing values, although smaller and larger pitch values may be used.

As seen in the various cross-sectional views, a shallow trench isolation (STI) layer 200 may be used to provide electrical isolation between the fins 120 and between adjacent devices as is needed for the circuit(s) being formed. An STI process for FinFET devices involves creating isolation trenches in the semiconductor substrate 100 through an anisotropic etch process. The isolation trench between each adjacent fin may have a relatively high aspect ratio (e.g., ratio of the depth of the isolation trench to its width). A dielectric filler material, such as silicon dioxide, is deposited into the isolation trenches, for example, using an enhanced high aspect ratio process (eHARP) to fill the isolation trenches. The deposited dielectric material may then be polished by a chemical-mechanical polishing (CMP) process that removes the excess dielectric material and creates a planar STI structure. The planarized oxide is then etched back to form a recessed, uniformly thick oxide isolation layer 200 between the fins 120, where upper sidewalls of the fins 120, i.e., sidewalls within active device region 124, can be exposed for further processing.

As shown in the illustrated embodiment, upper portions of the fins 120 may be conformally coated with a sacrificial gate oxide layer 310. The sacrificial gate oxide layer 310 may comprise silicon dioxide, for example, and may be formed over the fins within the active device region 124. The sacrificial gate oxide layer 310 may have a thickness of 2 to 3 nm. During the course of manufacturing the FinFET device, the sacrificial gate oxide 310 may be stripped from source and drain regions of the fins and/or channel regions of the fins.

A sacrificial gate layer 320 is disposed over the fins 120. The sacrificial gate layer 320 is formed over the fins 120 and over the STI layer 200, i.e., directly over the active device region 124. The sacrificial gate layer 320 may comprise a blanket layer of amorphous silicon (a-Si), for example. Amorphous elemental silicon can be deposited using chemical vapor deposition, such as low pressure chemical vapor deposition (LPCVD) at temperatures ranging from 450° C. to 700° C. Silane ($SiH_4$) can be used as the precursor for CVD silicon deposition. The sacrificial gate layer 320 may have a thickness sufficient to completely cover the fins. For instance, a thickness of sacrificial gate layer 320 may range from 50 to 200 nm, e.g., 50, 75, 100, 125, 150, 175 or 200 nm, including ranges between any of the foregoing values, although lesser and greater thicknesses may be used. A CMP process may be used to planarize a top surface of the sacrificial gate layer 320.

"Planarization" refers to a material removal process that employs at least mechanical forces, such as frictional media, to produce a substantially two-dimensional surface. A planarization process may include chemical mechanical polishing (CMP) or grinding. Chemical mechanical polishing (CMP) is a material removal process that uses both chemical reactions and mechanical forces to remove material and planarize a surface.

Optionally, a sacrificial oxide layer (not shown) may be deposited over the sacrificial gate layer 320 prior to a CMP step and then subsequently removed during the CMP step in order to enhance planarization. During the planarization step, the sacrificial gate layer 320 may serve as a CMP etch stop. In certain embodiments, a non-selective etch such as a reactive ion etch (RIE) of the post-planarized sacrificial gate layer 320 may be used to define the thickness of the sacrificial gate layer 320.

As will be described in further detail below, sacrificial gate layer 320 is adapted to be patterned and provide a structure for a replacement metal gate (RMG) module used to define a three-dimensional gate architecture over the fins. Although only a pair of fins 120 is shown for clarity, depending on the design requirements for the associated device(s), the number of fins underlying the sacrificial gate layer 320 may independently vary from 2 to 100, although a greater number of fins may be used.

Referring to FIG. 2, prior to patterning the sacrificial gate layer 320 to form sacrificial gates, a gate cut opening 350 is formed in the sacrificial gate layer 320 between a pair of adjacent fins. The gate cut opening 350 may be formed using conventional lithography and etching techniques. For instance, as shown in FIG. 2 and FIGS. 2A-2C, a hardmask 330 may be formed directly over the sacrificial gate layer 320 and used as an etch mask to pattern the gate cut opening 350. The hardmask may include a layer of silicon nitride, for example.

The pattern transfer etching process to form gate cut opening 350 is typically an anisotropic etch. In certain embodiments, a dry etching process such as, for example, reactive ion etching (RIE) can be used. In other embodiments, a wet chemical etchant can be used. In still further embodiments, a combination of dry etching and wet etching can be used.

In addition to the hardmask 330, patterning and etching to form the gate cut opening 350 may include forming a lithography stack (not shown) over the sacrificial gate layer 320, i.e., over hardmask 330. A lithography stack may include one or more of a photoresist layer, an etch stop layer, an amorphous carbon layer, an adhesion layer, an oxide layer, and a nitride layer. Such layers may be configured as known to those skilled in the art to provide a suitable masking layer to pattern and etch the underlying layer(s).

A gate cut opening 350 may have areal dimensions (length and width) that independently range from 15 to 40 nm, although lesser and greater dimensions may be used. According to various embodiments, the areal dimensions of the as-formed gate cut openings 350 are within lithography process windows for forming such structures, and enable the gate cut openings 350 to be defined with substantially vertical sidewalls. As used herein, "substantially vertical" sidewalls deviate from a direction normal to a major surface of the substrate by less than 5°, e.g., 0, 1, 2, 3, 4, or 5°, including ranges between any of the foregoing values. In certain embodiments, the width (w) of the gate cut opening 350 is less than 20 nm, e.g., 5, 10 or 15 nm.

Referring still to FIG. 2 and FIGS. 2A-2C, it will be appreciated that, the sacrificial gate layer 320 is exposed along sidewalls of the gate cut opening 350, while the sacrificial gate oxide layer 310 is exposed at the bottom of the gate cut opening 350.

In various embodiments, a distance (g) between the sidewall of the gate cut opening and an adjacent fin 120 may be less than 20 nm, e.g., 12, 14, 16 or 18 nm, including ranges between any of the foregoing values. Decreasing the distance (g) beneficially impacts the achievable density of devices. However, decreasing the distance between adjacent structures may introduce design and processing challenges. As will be appreciated, such challenges may include the deposition of a functional gate stack, including a gate dielectric layer, gate conductor layer and conductive fill material within the available geometry, e.g., over the fin 120 within the space between the fin and the sidewall of the gate cut. Using the presently-disclosed methods, a structure can be formed having a precisely controlled distance between the sidewall of a gate cut dielectric and an adjacent fin without altering the design rules for the structure.

Referring to FIG. 3 and FIGS. 3A-3C, the gate cut opening 350 is backfilled with a sacrificial isolation layer 410. A polishing step may be used to remove the overburden. According to various embodiments, the sacrificial isolation layer 410 includes a material that may be etched selectively with respect to the sacrificial gate layer 320.

As used herein, the terms "selective" or "selectively" in reference to a material removal or etch process denote that the rate of material removal for a first material is greater than the rate of removal for at least another material of the structure to which the material removal process is applied. For example, in certain embodiments, a selective etch may include an etch chemistry that removes a first material selectively to a second material by a ratio of 2:1 or greater, e.g., 5:1, 10:1 or 20:1.

An example sacrificial isolation layer 410 includes silicon germanium (SiGe). The sacrificial isolation layer 410 may be formed by atomic layer deposition (ALD), chemical vapor deposition, such as metalorganic chemical vapor deposition (MOCVD) or metalorganic vapor phase epitaxy (MOVPE) from gaseous precursors such as silane ($SiH_4$) or dichlorosilane ($SiH_2Cl_2$) and $GeH_4$. Deposition of the sacrificial isolation layer 410 may be performed at a constant temperature between 300° C. and 550° C. The sacrificial isolation layer 410, which may be amorphous, may include 25 to 50 atomic percent germanium and may have a thickness sufficient to completely fill the gate cut opening 350.

Referring to FIG. 4 and FIGS. 4A-4C, according to certain embodiments, a spacer layer 420 may be formed within the gate cut opening 350, e.g., over exposed sidewalls of the sacrificial gate layer 320, prior to depositing the sacrificial isolation layer 410. The spacer layer 520 may include a layer of amorphous silicon (a-Si), for example, and may be used to control, i.e., decrease, a critical dimension (length and/or width) of the gate cut opening 350. An example spacer layer 420 has a thickness of 3 to 6 nm.

In an example method, the spacer layer 420 is deposited as a conformal layer over the structure of FIG. 2 and FIGS. 2A-2C, followed by an anisotropic etch to remove the spacer layer material from horizontal surfaces.

As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space.

Following deposition of the spacer layer 420, the sacrificial isolation layer 410 is deposited to fill the gate cut opening 350, followed by a planarization step to remove the overburden.

Referring to FIG. 5 and FIGS. 5A-5C, hardmask 330 is formed over the planarized structure and conventional photolithography and etching techniques, e.g., using hardmask 330 as an etch mask, are used to pattern and etch the sacrificial gate layer 320 and the sacrificial isolation layer 410 to form a sacrificial gate 325. A directional etching process such as, for example, reactive ion etching (RIE) can be used to define one or more sacrificial gates 325. Sacrificial gates 325 straddle the fins 120 and include both the sacrificial gate layer 320 within active device regions, i.e., overlapping the fins 120, and the sacrificial isolation layer 410 within gate cut regions, i.e., over STI 200 between fins.

Referring to FIG. 6 and FIGS. 6A-6C, sidewall spacers 510 are formed over sidewalls of the sacrificial gates 325. Sidewall spacers 510 may be formed by blanket deposition of a spacer material (e.g., using atomic layer deposition) followed by a directional etch such as reactive ion etching (RIE) to remove the spacer material from horizontal surfaces. In the illustrated embodiment of FIG. 6, FIG. 6B and FIG. 6C, sidewall spacers 510 are disposed over sidewalls (vertical surfaces) of the sacrificial gates 325. That is, sidewall spacers 510 are disposed over the sacrificial gate layer 320 and the sacrificial isolation layer 410.

Suitable sidewall materials for sidewall spacers 510 include oxides, nitrides and oxynitrides, such as silicon dioxide, silicon nitride, silicon oxynitride, and low dielectric constant (low-k) materials such as amorphous carbon, SiOC, SiOCN and SiBCN, as well as a low-k dielectric material. In certain embodiments, the sidewall spacer 510 thickness is 4 to 20 nm, e.g., 4, 10, 15 or 20 nm, including ranges between any of the foregoing values.

As used herein, the compounds silicon dioxide and silicon nitride have compositions that are nominally represented as $SiO_2$ and $Si_3N_4$, respectively. The terms silicon dioxide and silicon nitride, refer to not only these stoichiometric compositions, but also to oxide and nitride compositions that deviate from the stoichiometric compositions.

Referring still to FIG. 6 and FIGS. 6A-6C, following formation of the sidewall spacers 510, source/drain junctions 520 may be formed over source/drain regions of the fins by ion implantation or selective epitaxy, e.g., using the sidewall spacers 510 as an alignment mask. According to various embodiments, source/drain junctions 520 may include silicon (e.g., Si) or a silicon-containing material such as silicon germanium (SiGe). For instance, SiGe source/drain junctions may be incorporated into a p-MOS device to provide compressive stress to the channel, which can improve carrier mobility.

The terms "epitaxy," "epitaxial" and/or "epitaxial growth and/or deposition" refer to the growth of a semiconductor material layer on a deposition surface of a semiconductor material, in which the semiconductor material layer being grown assumes the same crystalline habit as the semiconductor material of the deposition surface. For example, in an epitaxial deposition process, chemical reactants provided by source gases are controlled and the system parameters are set so that depositing atoms alight on the deposition surface and remain sufficiently mobile via surface diffusion to orient themselves according to the crystalline orientation of the atoms of the deposition surface. Therefore, an epitaxial semiconductor material has the same crystalline characteristics as the deposition surface on which it is formed. Example epitaxial growth processes include low energy plasma deposition, liquid phase epitaxy, molecular beam epitaxy, and atmospheric pressure chemical vapor deposition.

The source/drain junctions 520 may be doped, which may be performed in situ, i.e., during epitaxial growth, or following epitaxial growth, for example, using ion implantation or plasma doping. Doping changes the electron and hole carrier concentrations of an intrinsic semiconductor at thermal equilibrium. A doped layer or region may be p-type or n-type.

As used herein, "p-type" refers to the addition of impurities to an intrinsic semiconductor that creates a deficiency of valence electrons. In a silicon-containing fin, example p-type dopants, i.e., impurities, include but are not limited to boron, aluminum, gallium, and indium. As used herein, "n-type" refers to the addition of impurities that contribute free electrons to an intrinsic semiconductor. In a silicon-containing fin, example n-type dopants, i.e., impurities, include but are not limited to, antimony, arsenic, and phosphorus.

An optional drive-in anneal can be used to diffuse dopant species and generate a desired dopant profile. In certain embodiments, dopant atoms within the source/drain junctions 520 may be diffused into the semiconductor fin 120 using a post-epitaxy or post-implantation anneal (e.g., at a temperature of 600° C. to 1400° C.) to create a desired dopant profile within a fin.

Referring still to FIG. 6 and FIGS. 6A-6C, a conformal liner and interlayer dielectric (ILD) (collectively 550) are successively formed over the source/drain junctions 520 and over sidewall spacers 510 to fill the trench over the source/drain junctions 520, i.e., within contact locations over the source/drain junctions 520, and the resulting structure is planarized, optionally using hard mask 330 as an etch stop layer. The conformal liner may include silicon nitride, and the ILD may include silicon dioxide. The conformal liner and the ILD may be formed by atomic layer deposition (ILD) or chemical vapor deposition (CVD).

Referring to FIG. 7 and FIGS. 7A-7C, hardmask 330 is removed and, using a selective etch, the sacrificial isolation layer 410 is removed from within the gate cut openings 350. Silicon germanium (SiGe) can be etched selectively with respect to silicon dioxide, silicon nitride and amorphous silicon, for example, without utilizing an etch mask using gas phase HCl or a wet etchant that includes hydrogen peroxide. Thus, remaining portion of the sacrificial gate layer 320 is re-exposed along sidewalls of the gate cut opening 350, and the sacrificial gate oxide layer 310 is re-exposed at the bottom of the gate cut opening 350.

Referring to FIG. 8 and FIGS. 8A-8C, an isolation layer 610 is then deposited within self-aligned locations within gate cut openings 350. The isolation layer 610 may include a dielectric material such as silicon nitride, SiCO, SiCN, SiOCN, and the like, and may be formed by atomic layer deposition (ALD). According to various embodiments, the isolation layer 610 and the sacrificial gate layer 320 are formed from materials that can be etched selectively with respect to each other.

As will be appreciated, the gate cut openings 325 are backfilled with isolation layer 610 in order to isolate the various sacrificial gate structures and hence the later-formed functional gates associated with respective devices.

Referring to FIG. 9 and FIGS. 9A-9C, remaining portions of the sacrificial gate layer 320 are removed to form openings over channel regions of the fins, and a functional gate 700 is formed within each opening. The functional gate 700 includes a gate dielectric layer 710 and an overlying gate conductor layer 720.

The gate dielectric layer 710 may include silicon dioxide or a high-k material. In various embodiments, the gate dielectric 710 is a composite layer and includes a thin layer (e.g., 0.5 nm) of silicon oxide and an overlying layer of high-k dielectric material.

As used herein, a high-k material has a dielectric constant greater than that of silicon dioxide. A high-k dielectric may include a binary or ternary compound such as hafnium oxide ($HfO_2$). Further exemplary high-k dielectrics include, but are not limited to, $ZrO_2$, $La_2O_3$, $Al_2O_3$, $TiO_2$, $SrTiO_3$, $BaTiO_3$, $LaAlO_3$, $Y_2O_3$, $HfO_xN_y$, $HfSiO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, $SiO_xN_y$, $SiN_x$, a silicate thereof, and an alloy thereof. Each value of x may independently vary from 0.5 to 3, and each value of y may independently vary from 0 to 2. The thickness of the high-k layer 610 may range from 1 nm to 10 nm, e.g., 1, 2, 4, 6, 8 or 10 nm, including ranges between any of the foregoing.

In particular embodiments, a conformal gate dielectric layer 710 is formed over the top and sidewall surfaces of the fin 120, i.e., directly over the active device region 124, as well as over sidewalls and top surfaces of the sidewall spacers 510 and ILD 550.

The gate dielectric layer 710 may be deposited by a suitable process such as atomic layer deposition (ALD), chemical vapor deposition (CVD), physical vapor deposition (PVD), thermal oxidation, UV-ozone oxidation, or combinations thereof. The gate dielectric thickness may range from 1 nm to 10 nm, e.g., 1, 2, 4, 6, 8 or 10 nm, including ranges between any of the foregoing values.

In various embodiments, the sacrificial gate oxide 310 may be removed from over the channel regions of the fins prior to forming the gate dielectric layer 710. For example, the sacrificial gate oxide 310 can be etched using a buffered oxide etch, which can include a wet etching process or a vapor etching process that uses a buffered hydrofluoric acid (BHF) solution. By way of example, the BHF solution may include hydrofluoric acid (HF), ammonium fluoride ($NH_4F$) and water ($H_2O$). In a particular embodiment, the BHF solution contains 0.5 to 10 vol. % hydrofluoric acid, 30 to 50 vol. % ammonium fluoride, and 40 to 60 vol. % water. The BHF solution selectively etches the oxide layer 310 without etching the other layers of the structure.

A gate conductor layer 720 is then formed over the gate dielectric layer 710. The gate conductor 720 may include a conductive material such as polysilicon, silicon-germanium, a conductive metal such as Al, W, Cu, Ti, Ta, W, Co, Pt, Ag, Au, Ru, Ir, Rh and Re, alloys of conductive metals, e.g., Al—Cu, silicides of a conductive metal, e.g., W silicide, and Pt silicide, or other conductive metal compounds such as TiN, TiC, TiSiN, TiTaN, TaN, TaAlN, TaSiN, TaRuN, WSiN, NiSi, CoSi, as well as combinations thereof.

The gate conductor 720 may include one or more layers of such materials such as, for example, a metal stack including a work function metal layer and/or a conductive liner, and may have a thickness of 20 to 40 nm. In certain embodiments, the gate conductor 720 includes a titanium nitride (TiN) layer directly over the gate dielectric layer 610 and a tungsten (W) or cobalt (Co) fill layer over the titanium nitride layer.

Referring still to FIG. 9 and FIGS. 9A-9C, to form conductive contacts to the source/drain junctions, the ILD and conformal liner 550 are removed to form self-aligned contact openings. Removal of the ILD and the conformal liner from over source/drain junctions 520 can be performed using one or more etch steps that are is selective to the adjacent, exposed layers. For instance, the conformal liner can be removed by a reactive ion etch or isotropic etch such as a wet etch or an isotropic plasma etch. An example wet etch chemistry that can be used to remove the conformal liner includes phosphoric acid.

A conductive contact 810 is then formed within the contact openings and over exposed surfaces of the source/drain junctions 520 by depositing, for example, a conductive liner and a barrier layer (not separately shown) and then filling the contact openings with a conductive material such as tungsten or cobalt. The conductive liner is typically titanium and the barrier layer may be titanium nitride (TiN).

Conductive contacts 810 may include a metal that forms an ohmic contact with the source/drain junctions 520. A silicide layer (e.g., titanium silicide) may be formed in situ via reaction between the conductive liner (e.g., titanium) and the source/drain junctions 520 to form a trench silicide contact.

Figure 9:
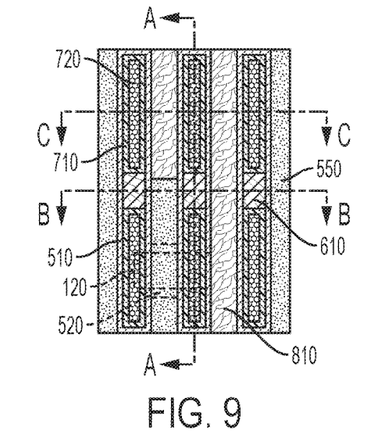
FIG. 9 shows removal of the sacrificial gates, the formation of functional gates over respective channel regions of the fins, and the formation of conductive contacts over source/drain regions of the fins.
Figure 9A:
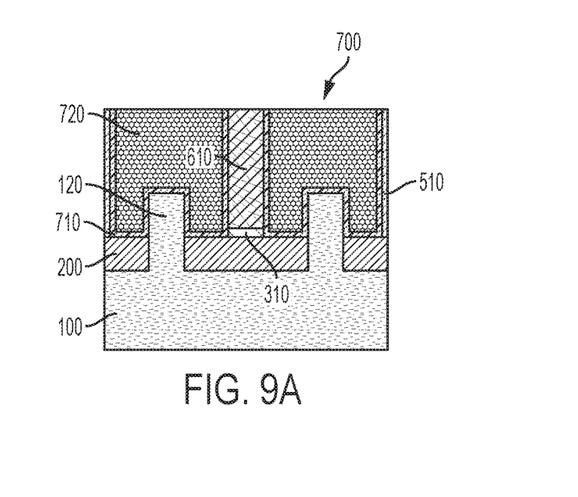
FIG. 9A depicts a pair of functional gates separated by an isolation layer.
Figure 9B:
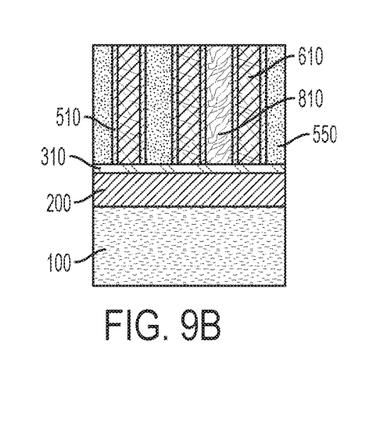
FIG. 9B shows the formation of a conductive source/drain contact extending between source/drain regions of adjacent fins.
Figure 9C:
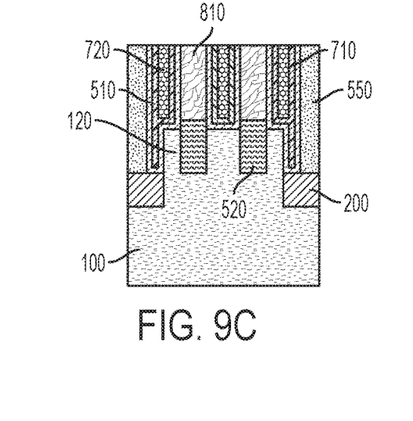
FIG. 9C shows the formation of a functional gate over a channel region of the fin and the formation of conductive contacts over source/drain regions of the fin.

After formation of the conductive contacts 810, a planarization process may be used to form a planarized structure as shown in FIGS. 9A-9C, where a top surface of the conductive contacts 810 is co-planar with a top surface of the sidewall spacers 510 and the functional gate 700. Independent transistors may be connected by local interconnection methods and/or back end of the line metallization layers to form integrated circuits, such as SRAM devices.

The gate isolation methods and structures described herein leverage the formation of a sacrificial isolation layer 410 within the gate cut region of a sacrificial gate layer prior to patterning the sacrificial gate layer to form a sacrificial gate. By defining the gate cut locations with a sacrificial isolation layer 410 prior to patterning the sacrificial gate, etch damage to the sidewall spacers and exposure of the underlying sacrificial gate layer prior to the formation of the source/drain junctions can be decreased, and unwanted epitaxial growth from the exposed sacrificial gate can be avoided.

As described herein, the formation or deposition of a layer or structure, including the foregoing layers and structures, may involve one or more techniques suitable for the material or layer being deposited or the structure being formed. In addition to techniques or methods specifically mentioned, various techniques include, but are not limited to, chemical vapor deposition (CVD), low-pressure chemical vapor deposition (LPCVD), plasma enhanced chemical vapor deposition (PECVD), microwave plasma chemical vapor deposition (MPCVD), metal organic CVD (MOCVD), atomic layer deposition (ALD), molecular beam epitaxy (MBE), electroplating, electroless plating, ion beam deposition, spin-on coating, thermal oxidation, and physical vapor deposition (PVD) techniques such as sputtering or evaporation.

As used herein, the singular forms "a," "an" and "the" include plural referents unless the context clearly dictates otherwise. Thus, for example, reference to a "work function metal layer" includes examples having two or more such "work function metal layers" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to an isolation layer that comprises silicon dioxide include embodiments where an isolation layer consists essentially of silicon dioxide and embodiments where an isolation layer consists of silicon dioxide.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a device, comprising:
   forming a plurality of fins over a semiconductor substrate;
   forming a dielectric layer over the substrate and between the fins;
   depositing a sacrificial gate layer over the fins and over the dielectric layer;
   forming a first opening in the sacrificial gate layer between a pair of the fins, wherein the dielectric layer is exposed at a bottom of the first opening;
   depositing a sacrificial isolation layer within the first opening;
   etching the sacrificial gate layer and the sacrificial isolation layer to form a sacrificial gate;
   forming a spacer layer over sidewalls of the sacrificial gate;
   removing the sacrificial isolation layer from within the first opening after forming the spacer layer;
   depositing an isolation layer within the first opening;
   etching remaining portions of the sacrificial gate layer selectively with respect to the isolation layer to form a second opening;
   forming a gate dielectric layer within the second opening; and
   forming a gate conductor layer over the gate dielectric layer.

2. The method of claim 1, wherein the sacrificial gate layer comprises amorphous silicon and the sacrificial isolation layer comprises silicon germanium.

3. The method of claim 1, further comprising forming a critical dimension modification layer over sidewalls of the first opening prior to depositing the sacrificial isolation layer within the first opening.

4. The method of claim 3, wherein the critical dimension modification layer comprises amorphous silicon.

5. The method of claim 1, further comprising forming source/drain junctions over source/drain regions of at least one of the fins using the sacrificial gate and the spacer layer as an alignment mask prior to removing the sacrificial isolation layer.

6. The method of claim 1, wherein the sacrificial isolation layer is removed from within the first opening prior to removing the remaining portions of the sacrificial gate layer.

7. The method of claim 1, wherein the fin is exposed at a bottom of the second opening prior to forming the gate dielectric layer.

8. The method of claim 1, further comprising polishing the sacrificial isolation layer such that a top surface of the sacrificial isolation layer is co-planar with a top surface of the sacrificial gate layer.

9. A method of forming a device, comprising:
   forming a plurality of fins over a substrate;
   depositing a sacrificial gate layer over the fins;
   forming a first opening in the sacrificial gate layer between a pair of the fins;
   depositing a sacrificial isolation layer within the first opening;
   etching the sacrificial gate layer and the sacrificial isolation layer to form a sacrificial gate;
   forming a spacer layer over sidewalls of the sacrificial gate;
   removing the sacrificial isolation layer from within the first opening after forming the spacer layer;
   depositing an isolation layer within the first opening;
   removing remaining portions of the sacrificial gate layer to form a second opening, wherein at least one of the plurality of fins is exposed at a bottom of the second opening;
   forming a gate dielectric layer within the second opening; and
   forming a gate conductor layer over the gate dielectric layer.

10. The method of claim 9, wherein the sacrificial gate layer comprises amorphous silicon and the sacrificial isolation layer comprises silicon germanium.

11. The method of claim 9, further comprising forming a critical dimension modification layer over sidewalls of the first opening prior to depositing the sacrificial isolation layer within the first opening.

12. The method of claim 11, wherein the critical dimension modification layer comprises amorphous silicon.

13. The method of claim 9, further comprising forming source/drain junctions over source/drain regions of at least one of the fins using the sacrificial gate and the spacer layer as an alignment mask prior to removing the sacrificial isolation layer.

14. The method of claim 9, wherein the sacrificial isolation layer is removed from within the first opening prior to removing the remaining portions of the sacrificial gate layer.

15. The method of claim 9, further comprising polishing the sacrificial isolation layer such that a top surface of the sacrificial isolation layer is co-planar with the top surface of the sacrificial gate layer.

* * * * *